(12) United States Patent
Lu

(10) Patent No.: US 11,304,322 B2
(45) Date of Patent: Apr. 12, 2022

(54) LOCKING STRUCTURE AND SERVER CABINET WITH SAME

(71) Applicant: HONGFUJIN PRECISION ELECTRONICS(TIANJIN)CO., LTD., Tianjin (CN)

(72) Inventor: Wen-Hu Lu, Tianjin (CN)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 94 days.

(21) Appl. No.: 16/895,144

(22) Filed: Jun. 8, 2020

(65) Prior Publication Data
US 2021/0267075 A1 Aug. 26, 2021

(30) Foreign Application Priority Data
Feb. 25, 2020 (CN) .......................... 202010117551.1

(51) Int. Cl.
*H05K 5/02* (2006.01)
*G06F 1/18* (2006.01)

(52) U.S. Cl.
CPC ........... *H05K 5/0221* (2013.01); *G06F 1/181* (2013.01); *H05K 5/0239* (2013.01)

(58) Field of Classification Search
CPC ..... H05K 5/0221; H05K 5/0239; G06F 1/181
USPC .................................. 312/223.1, 223.2, 215
See application file for complete search history.

(56) References Cited

U.S. PATENT DOCUMENTS

| | | | | |
|---|---|---|---|---|
| 4,828,299 A | * | 5/1989 | Poe | E05B 63/128 292/139 |
| 5,358,135 A | * | 10/1994 | Robbins | H02B 1/066 220/326 |
| 7,325,846 B2 | * | 2/2008 | Smith | E05C 19/006 292/137 |
| 9,727,099 B1 | * | 8/2017 | Hastings | G06F 1/187 |
| 2004/0021325 A1 | * | 2/2004 | Schlack | H05K 7/1409 292/110 |
| 2011/0127895 A1 | * | 6/2011 | Conn | H05K 5/02 312/294 |
| 2019/0394893 A1 | * | 12/2019 | Wu | H05K 5/0226 |

FOREIGN PATENT DOCUMENTS

TW M529350 U 9/2016

* cited by examiner

*Primary Examiner* — James O Hansen
(74) *Attorney, Agent, or Firm* — ScienBiziP, P.C.

(57) ABSTRACT

A locking structure applied to lock a first housing of a server cabinet to a second housing includes a main body, a control portion, a driving portion, and a hand-held portion. The main body is positioned at the first housing. The control portion is positioned inside the main body. One end of the driving portion is rotatably mounted to the control portion. One end of the hand-held portion is rotatably connected to the main body and other end of the driving portion. When the other end of the hand-held portion is operated, the hand-held portion moves towards the main body, and the driving portion moves the control portion, thereby driving the first housing to move towards the second housing.

15 Claims, 7 Drawing Sheets

LOCKING STRUCTURE AND SERVER CABINET WITH SAME

FIELD

The subject matter herein generally relates to server construction and a locking structure.

BACKGROUND

At present, a cabinet of a server is locked by a door lock or a screw. Fixing the cabinet with screws is not at all convenient, disassembly and assembly are troublesome, and the screws can easily be lost. When the door lock is used, it must be opened with a key.

Therefore, there is room for improvement within the art.

BRIEF DESCRIPTION OF THE DRAWINGS

Many aspects of the disclosure can be better understood with reference to the figures. The components in the figures are not necessarily drawn to scale, the emphasis instead being placed upon clearly illustrating the principles of the disclosure.

DETAILED DESCRIPTION

Figure 1:
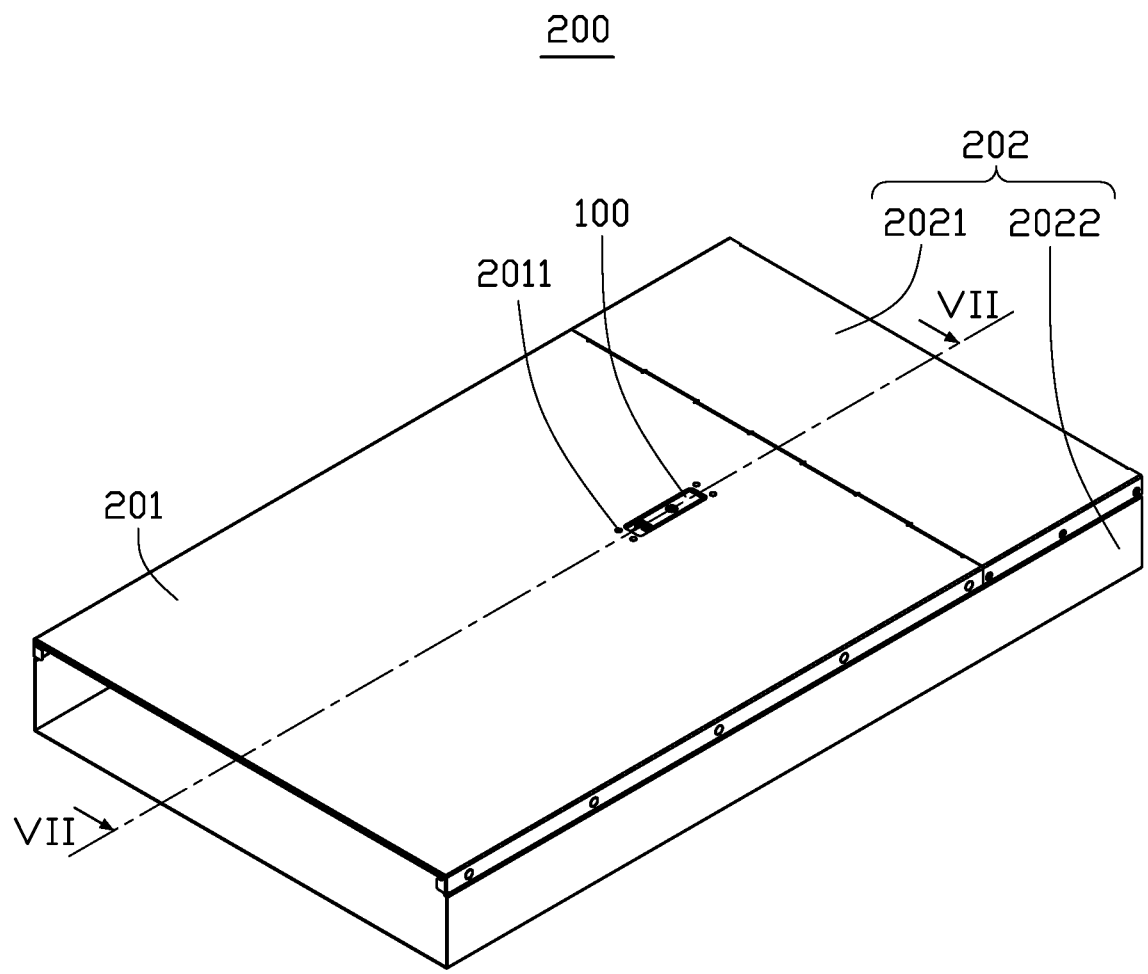
FIG. 1 is an isometric view of a server cabinet according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 illustrates a server cabinet 200 according to an embodiment of the present disclosure. The server cabinet 200 includes a first housing 201, a second housing 202, and a locking structure 100. The locking structure 100 is positioned on the first housing 201 to drive the first housing 201 to move towards the second housing 202.

In this embodiment, the second housing 202 includes an upper housing 2021 and a lower housing 2022. The upper housing 2021 covers one end of the lower housing 2022. The other end of the lower housing 2022 is covered by the first housing 201. The first housing 201 further defines an opening (not shown). The opening corresponds to the locking structure 100. The locking structure 100 is positioned at the opening and drives the first housing 201 to move towards the upper housing 2021. Thereby, the first housing 201 is locked with the upper housing 2021 through the locking structure 100.

Figure 2:
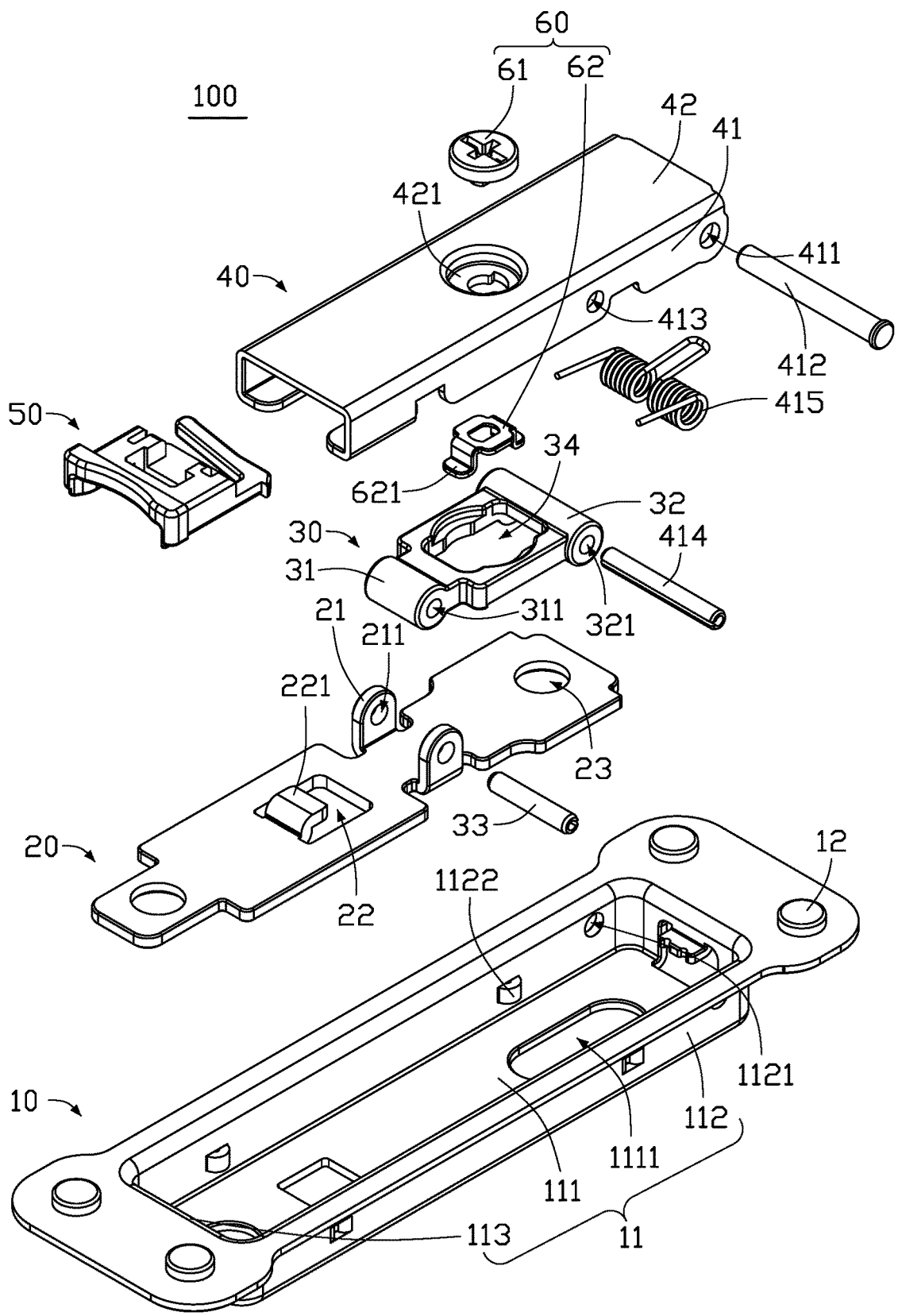
FIG. 2 is an exploded, isometric view of a locking structure of the server cabinet of FIG. 1.

Referring to FIG. 2, the locking structure 100 includes a main body 10, a control portion 20, a driving portion 30, and a hand-held portion 40. The main body 10 is positioned at the first housing 201. The control portion 20 is positioned inside the main body 10. One end of the driving portion 30 is rotatably mounted to the control portion 20. Another end of the driving portion 30 is rotatably connected to the hand-held portion 40. One end of the hand-held portion 40 is also rotatably mounted to the main body 10. When the hand-held portion 40 is operated, it moves towards the main body 10, then the rotatably connected driving portion 30 drives the control portion 20 to move, thereby moving the first housing 201 towards the second housing 202.

In this embodiment, the main body 10 has a generally rectangular plate structure. A middle portion of the main body 10 is recessed to form a receiving slot 11. The receiving slot 11 receives the control portion 20, the driving portion 30, and the hand-held portion 40. The receiving slot 11 includes a bottom wall 111, two first side walls 112, and two end walls 113. The two first side walls 112 are positioned parallel to each other. The two end walls 113 are also positioned parallel to each other. The two first side walls 112 and the two end walls 113 are all perpendicularly connected to a periphery of the bottom wall 111. The bottom wall 111, the two first side walls 112, and the two end walls 113 cooperatively form the receiving slot 11. In this embodiment, each of the two first side walls 112 defines a first mounting hole 1121.

In this embodiment, the receiving slot 11 corresponds to the opening of the first housing 201. The receiving slot 11 of the main body 10 is exposed from the opening. Each of the two end walls 113 of the main body 10 forms at least one fixing portion 12 along a direction away from the receiving slot 11. The first housing 201 further defines at least one fixing hole 2011. In this embodiment, four corners of the opening define the fixing holes 2011. By mounting the fixing portion 12 into the fixing hole 2011, the main body 10 is fixed in position at the first housing 201 and is exposed from the opening.

The control portion 20 is received in the receiving slot 11. The control portion 20 has a substantially plate-like structure. The control portion 20 includes two connection portions 21. The two connecting portions 21 are formed by bending both sides of the control portion 20 along a direction away from the main body 10. Each connecting portion 21 defines a first rotating hole 211.

The driving portion 30 is rotatably connected to the control portion 20. Specifically, the driving portion 30 has a substantial plate structure. One end of the driving portion 30 includes a first rotating portion 31. The first rotating portion 31 axially defines a first shaft hole 311. A first rotating shaft 33 passes through the first rotating hole 211 and the first shaft hole 311 in that order, thereby one end of the driving portion 30 is rotatably connected to the control portion 20. The other end of the driving portion 30 opposite to the first rotating portion 31 includes a second rotating portion 32. The second rotating portion 32 is positioned apart from the first rotating portion 31 and axially defines a second shaft hole 321.

The hand-held portion 40 is accommodated in the receiving slot 11 and is rotatably connected to the other end of the driving portion 30. The hand-held portion 40 is also rotatably connected to the main body 10. In this embodiment, the hand-held portion 40 has a rectangular structure with an open end. The hand-held portion 40 includes two second side walls 41 and a top wall 42. The two second side walls 41 are oppositely arranged and connected to the top wall 42. Each of the two second side walls 41 defines a second mounting hole 411. The second mounting hole 411 matches the first mounting hole 1121. A mounting member 412 passes through the first mounting hole 1121 and the second mounting hole 411 in that order, thereby one end of the hand-held portion 40 is rotatably mounted to the first side walls 112 of the main body 10.

In this embodiment, a middle portion of each of the two second side walls 41 defines a second rotating hole 413. The second rotating hole 413 matches the second shaft hole 321. A second rotating shaft 414 passes through the second rotating hole 413 and the second shaft hole 321 in that order, thereby the hand-held portion 40 is rotatably connected to the other end of the driving portion 30.

In this embodiment, a torque spring 415 is also sleeved on the mounting member 412. The torsion spring 415 is configured to provide a torsion force when the hand-held portion 40 rotates relative to the main body 10.

In this embodiment, the locking structure 100 further includes a buckle portion 50. The buckle portion 50 is substantially a block structure. The buckle portion 50 is made of elastic material, such as plastic or the like. The buckle portion 50 is connected to an end of the hand-held portion 40 away from the second mounting hole 411. The end of the buckle portion 50 away from the hand-held portion 40 includes a hook portion 51 (see FIG. 4). The hook portion 51 cooperates with the control portion 20 to keep the hand-held portion 40 locked after the hand-held portion 40 is received in the receiving slot 11.

In this embodiment, the location of the control portion 20 close to the connection portions 21 defines a clamping hole 22. The clamping hole 22 passes through two opposite surfaces of the control portion 20. One side wall of the clamping hole 22 is extended to form a clamping portion 221. The clamping portion 221 cooperates with the hook portion 51 to lock the buckle portion 50 with the control portion 20.

In this embodiment, when the hand-held portion 40 moves towards the main body 10 and is received in the receiving slot 11, the hook portion 51 snaps into the clamping hole 22 and is fastened to the clamping portion 221, so that the locked state of the hand-held portion 40 is maintained after being received in the receiving slot 11.

Figure 3:
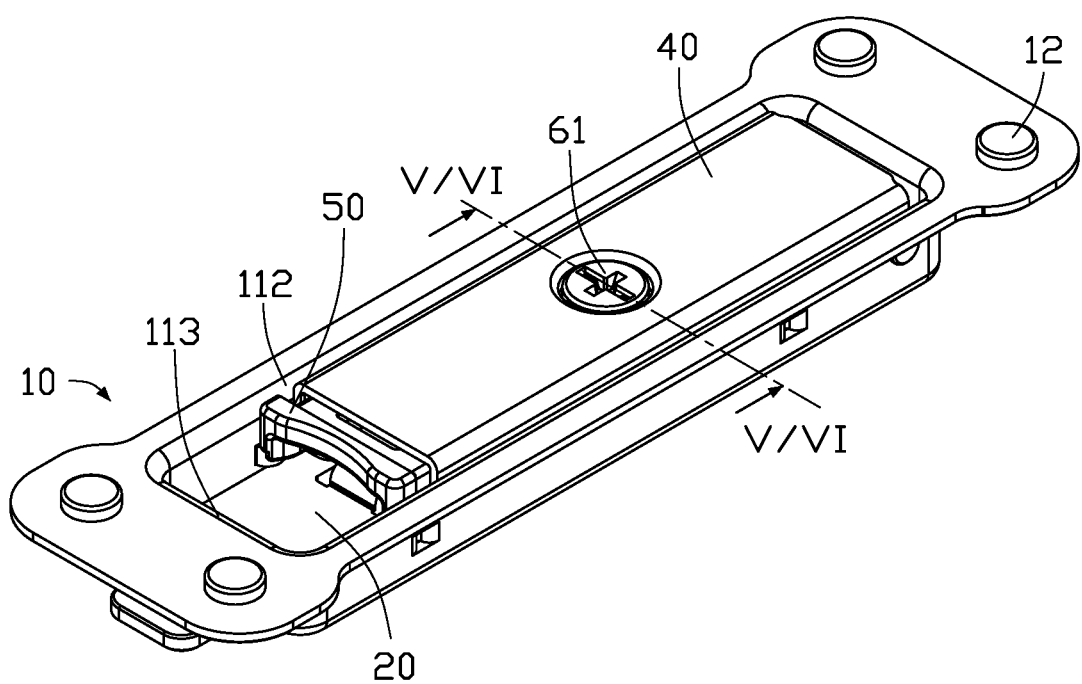
FIG. 3 is an isometric view showing the locking structure of FIG. 2 when locked.
Figure 4:
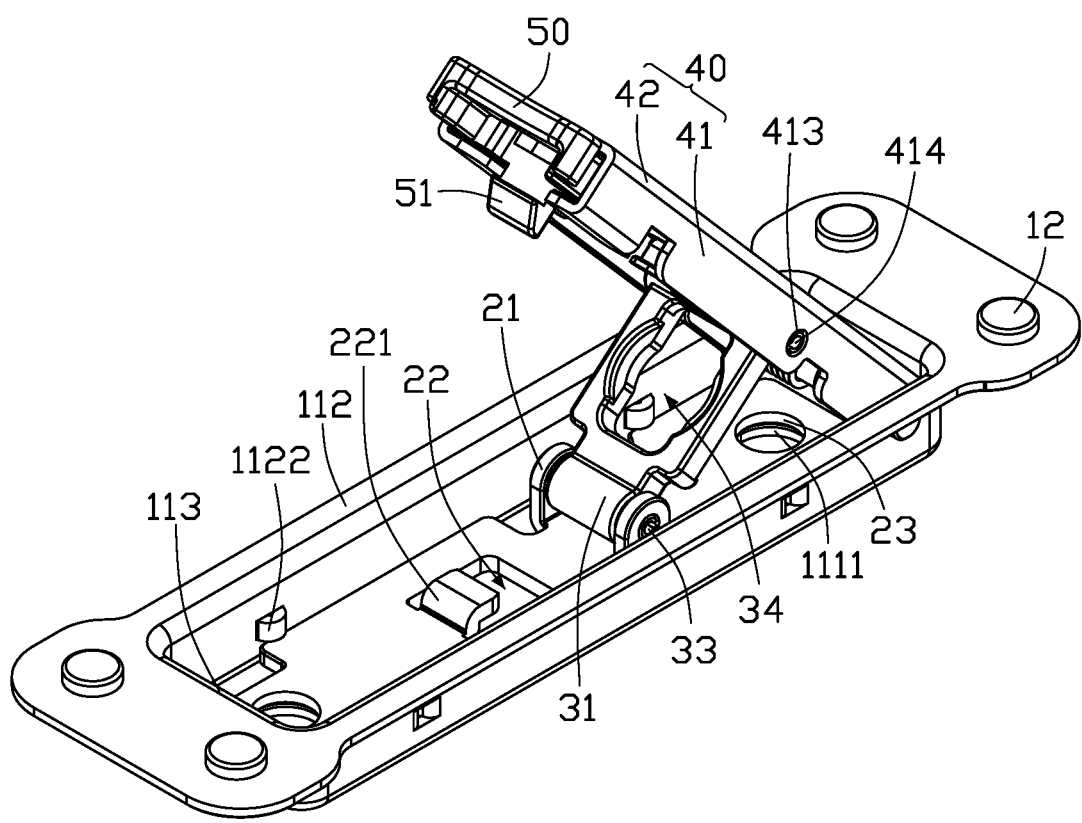
FIG. 4 is an isometric view showing the locking structure of FIG. 2 when unlocked.

As illustrated in FIG. 3 and FIG. 4, when assembling the locking structure 100, the control portion 20 is firstly received in the main body 10. The first rotating portion 31 of the driving portion 30 is rotatably connected to the control portion 20 through the first rotating shaft 33 passing through the first rotating hole 211 and the first shaft hole 311. One end of the hand-held portion 40 is rotatably connected to the main body 10 by the mounting member 412 passing through the first mounting hole 1121 and the second mounting hole 411. The hand-held portion 40 is further rotatably connected to the driving portion 30 by the second rotation shaft 414 passing through the second rotating hole 413 and the second shaft hole 321. Then, one end of the buckle portion 50 is connected to the end of the hand-held portion 40 away from the second mounting hole 411.

As illustrated in FIG. 3, when the locking structure 100 is to be locked, the end of the hand-held portion 40 close to the buckle portion 50 is pressed, and one end of the hand-held portion 40 wraps around the mounting member 412, causing the hand-held portion 40 to move along a direction towards the main body 10. At the same time, since the hand-held portion 40 is rotatably connected to the driving portion 30 by the second rotating shaft 414 passing through the second rotating hole 413 and the second shaft hole 321, the driving portion 30 drives the control portion 20 to move and the hand-held portion 40 is received in the main body 10. At this time, the control portion 20 moves to a location where the clamping hole 22 is aligned with the buckle portion 50. The hook portion 51 then buckles into the clamping portion 221, thus the locking structure 100 is locked and maintained in the locked state. When the locking structure 100 is locked, the torsion spring 415 accumulates energy.

As illustrated in FIG. 4, when the locking structure 100 is to be unlocked, the end of the buckle portion 50 away from the hand-held portion 40 is pressed. The hook portion 51 of the buckle portion 50 disengages from the clamping portion 221 and the torsion spring 415 releases energy, the hand-held portion 40 automatically springs away from the main body 10, and the locking structure 100 is unlocked.

In this embodiment, the locking structure 100 further includes a locking portion 60. When the hand-held portion 40 is locked to the main body 10 and the hook portion 51 is engaged with the clamping portion 221, the locking portion 60 locks with the driving portion 30 to further lock the locking structure 100.

In this embodiment, the locking portion 60 includes a first locking portion 61 and a second locking portion 62. The second locking portion 62 is connected to the first locking portion 61. The second locking portion 62 can rotate relative to the first locking portion 61. Each of two ends of the second locking portion 62 extends outward to form a locking end 621. The top wall 42 of the hand-held portion 40 defines a locking hole 421. A connecting hole 34 is defined between the first rotating portion 31 and the second rotating portion 32 of the driving portion 30. The connecting hole 34 is substantially elliptical. The first locking portion 61 is positioned in the locking hole 421 and passes through the second locking portion 62. The two locking ends 621 of the second locking portion 62 latch onto the side walls of the connecting hole 34.

In this embodiment, the first locking portion 61 may be a screw. The second locking portion 62 may be a locking bracket. The locking ends 621 are symmetrical locking hooks. When the first locking portion 61 is rotated, the second locking portion 62 rotates, so that the two locking ends 621 of the second locking portion 62 latch onto the side walls of the connecting hole 34, or are detached from the side walls of the connecting hole 34. The locking portion 60 is configured to lock the locking structure 100 and prevent the locking structure 100 being directly unlocked by hand.

Figure 5:
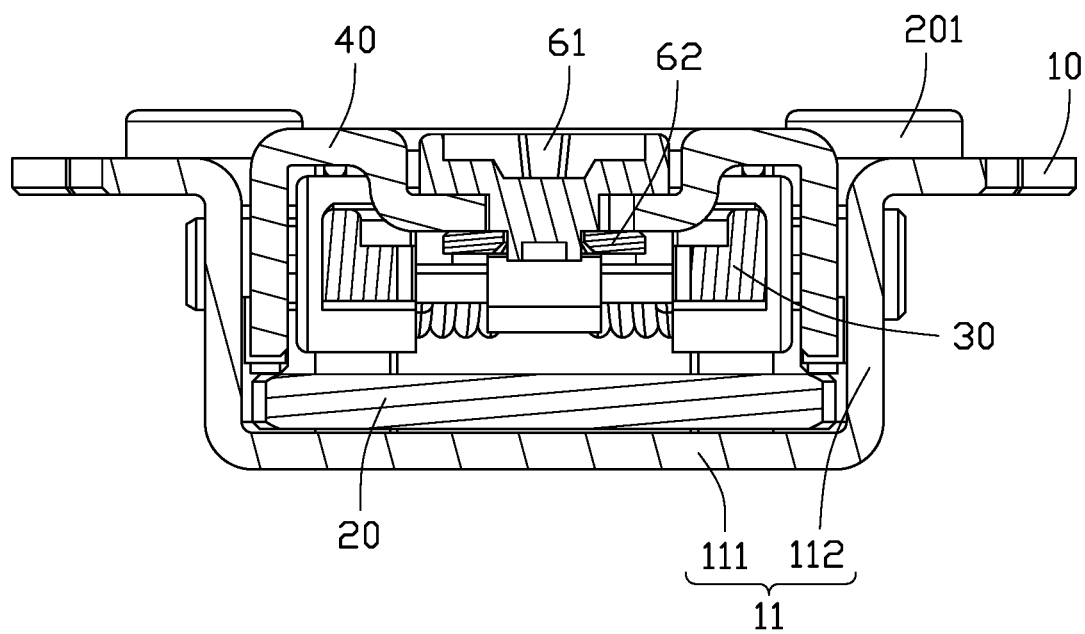
FIG. 5 is a cross-sectional view taken along line V-V of FIG. 3.
Figure 6:
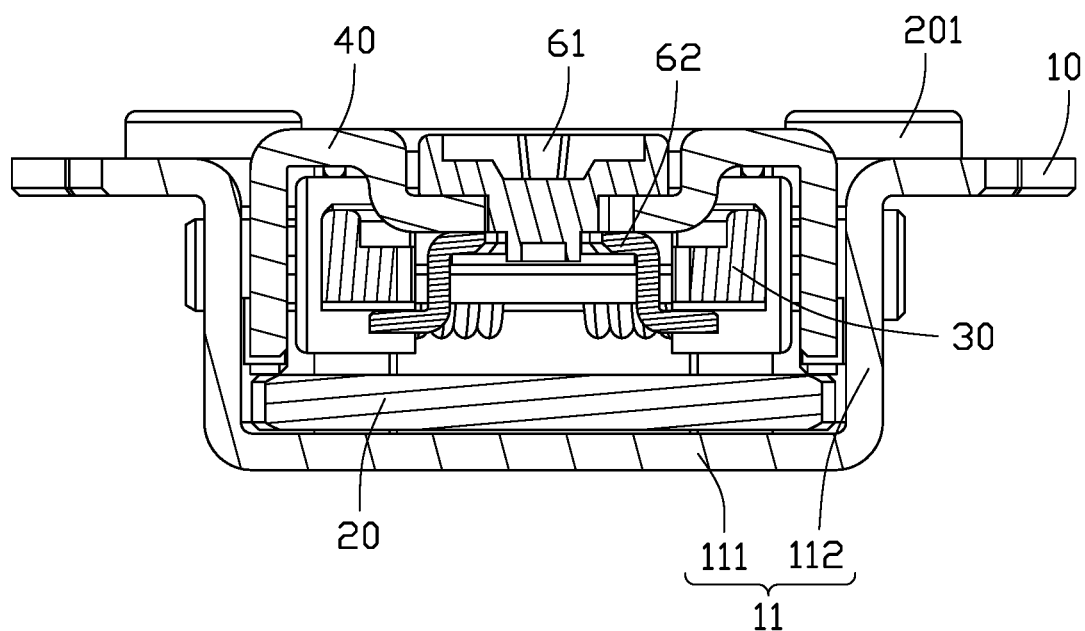
FIG. 6 is similar to FIG. 5, but shown from another angle.

Referring to FIGS. 5 and 6, after the locking structure 100 is locked, the locking portion 60 is further rotated, then the second locking portion 62 is clamped to the side walls of the connecting hole 34 of the driving portion 30, preventing the locking structure 100 from being directly unlocked without a tool. When the locking structure 100 needs to be unlocked, the locking portion 60 can be rotated along a direction at an angle, for example, the first locking portion 61 can be rotated clockwise at an angle of 90 degrees, the second locking portion 62 is thus disengaged from the side walls of the connecting hole 34 of the driving portion 30, and thereby the locking structure 100 is unlocked.

In this embodiment, each of the two first side walls 112 further forms a resisting portion 1122. When the control portion 20 is accommodated in the receiving slot 11, the resisting portion 1122 resists the control portion 20 to prevent the control portion 20 from being separated from the main body 10.

In this embodiment, the bottom wall 111 of the main body 10 defines a first through hole 1111. The control portion 20 defines a second through hole 23. When the locking structure 100 is locked, the second rotating portion 32 of the driving portion 30 is aligned with the first through hole 1111 and the second through hole 23.

Figure 7:
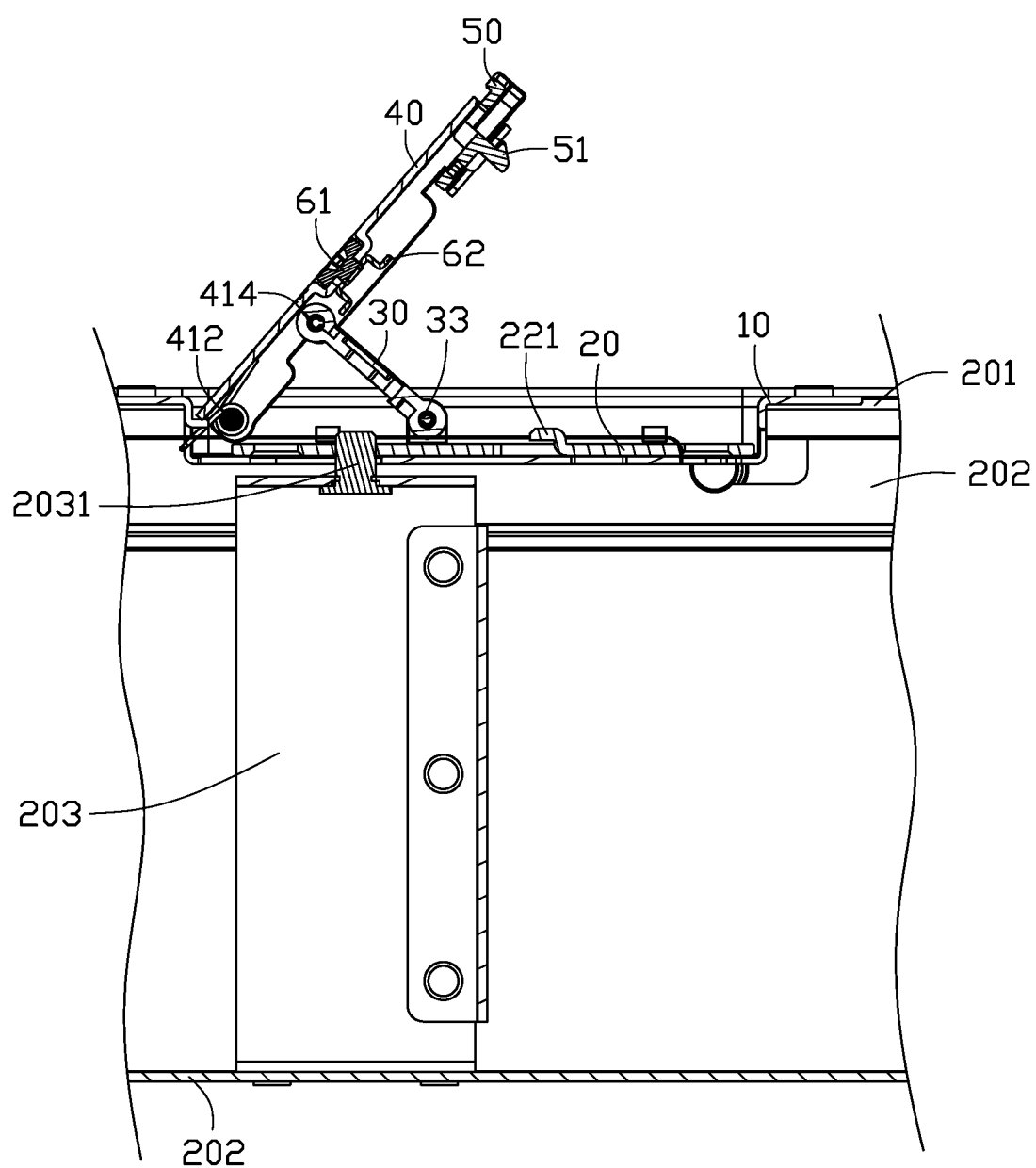
FIG. 7 is a cross-sectional view taken along line VII-VII of FIG. 1.

As illustrated in FIG. 7, in this embodiment, the server cabinet 200 further includes a lever 203. One end of the lever 203 is positioned on the second housing 202. The other end of the lever 203 passes through the first through hole 1111 and the second through hole 23 to abut against the driving portion 30. The lever 203 is configured to push the first housing 201 containing the locking structure 100 to move towards the second housing 202.

When assembling the locking structure 100 to the server cabinet 200, the fixing portion 12 is fixed into the fixing hole 2011, so that the main body 10 is fixed in position at one side of the first housing 201 and the receiving slot 11 is exposed from the opening. The control portion 20 is then received in the receiving slot 11. A pushing portion 2031 of the lever 203 passes through the first through hole 1111 and the second through hole 23 in that order. The ends of the driving portion 30 are rotatably connected to the main body 10 and the hand-held portion 40. One end of the hand-held portion 40 is rotatably connected to the main body 10 and the buckle portion 50 is connected to the other end of the hand-held portion 40.

When the locking structure 100 is not locked, the hand-held portion 40 moves towards the main body 10, and the driving portion 30 pushes the control portion 20 to move away from the first through hole 1111, thereby the pushing portion 2031 of the lever 203 moves the first housing 201 towards the second housing 202 to achieve a locking of the first housing 201 and the upper housing 2021.

In this embodiment, the driving portion 30 drives the main body 10 to move away from the first through hole 1111. Since the pushing portion 2031 of the lever 203 passes through the first through hole 1111 and the second through hole 23, the lever 203 moves the first housing 201 towards the second housing 202, thereby locking the first housing 201 with the second housing 202.

In this embodiment, when the first housing 201 and the second housing 202 are closed by the locking structure 100, the first locking portion 61 is rotated so that the second locking portion 62 locks the driving portion 30, and for safety the locking structure 100 cannot be opened without tools.

In this embodiment, the locking structure 100 is positioned on the first housing 201 of the server cabinet 200, the first housing 201 can be driven towards the second housing 202 by locking the locking structure 100 without tools. The locking structure 100 has a low cost, tool-free installation, and small space occupation.

It is believed that the embodiments and their advantages will be understood from the foregoing description, and it will be apparent that various changes may be made thereto without departing from the scope of the disclosure or sacrificing all of its advantages, the examples hereinbefore described merely being illustrative embodiments of the disclosure.

What is claimed is:

1. A locking structure applied to a server cabinet, the server cabinet comprising a first housing and a second housing, the locking structure comprising:
   a main body positioned at the first housing;
   a control portion positioned inside the main body;
   a driving portion with one end rotatably mounted to the control portion; and
   a hand-held portion with one end rotatably connected to the main body and rotatably connected to the other end of the driving portion;
   wherein when the other end of the hand-held portion is operated, the hand-held portion moves towards the main body, and the driving portion moves the control portion, thereby driving the first housing to move towards the second housing;
   wherein the control portion comprises two connecting portions, the two connecting portions are formed by bending both sides of the control portion along a direction away from the main body, each connecting portion defines a first rotating hole;
   wherein one end of the driving portion comprises a first rotating portion, the first rotating portion axially defines a first shaft hole, the one end of the driving portion is rotatably connected to the control portion with a first rotating shaft passing through the first rotating hole and the first shaft hole;
   wherein the other end of the driving portion opposite to the first rotating portion comprises a second rotating portion, the second rotating portion axially defines a second shaft hole;
   wherein the hand-held portion comprises two second side walls and a top wall, the two second side walls are oppositely arranged and connected to the top wall, a middle portion of each of the two second side walls defines a second rotating hole, the hand-held portion is rotatably connected to the other end of the driving portion with a second rotating shaft passing through the second rotating hole and the second shaft hole.

2. The locking structure of claim 1, wherein a middle portion of the main body is recessed to form a receiving slot, the receiving slot receives the control portion, the driving unit, and the hand-held unit.

3. The locking structure of claim 2, wherein the receiving slot comprises a bottom wall, two first side walls, and two end walls, the two first side walls are positioned parallel to each other, the two end walls are also positioned parallel to each other, the two first side walls and the two end walls are all perpendicularly connected to a periphery of the bottom wall to cooperatively form the receiving slot.

4. The locking structure of claim 3, wherein each of the two first side walls defines a first mounting hole, the hand-held portion comprises two second side walls and a top wall, the two second side walls are oppositely arranged and connected to the top wall, each of the two second side walls defines a second mounting hole, the hand-held portion is rotatably mounted to the main body by a mounting member passing through the first mounting hole and the second mounting hole.

5. The locking structure of claim 4, further comprising a buckle portion, wherein the buckle portion is connected to an end of the hand-held portion away from the second mounting hole, one end of the buckle portion away from the hand-held portion comprises a hook portion, the control portion defines a clamping hole, a side wall of the clamping hole is extended to form a clamping portion, the clamping portion cooperates with the hook portion to lock the buckle portion with the control portion.

6. The locking structure of claim 1, further comprising a locking portion, wherein the locking portion comprises a first locking portion and a second locking portion, each of two ends of the second locking portion extend outward to form a locking end, the hand-held portion defines a locking hole, a connecting hole is defined between the first rotating portion and the second rotating portion of the driving portion, the first locking portion is positioned in the locking hole and passes through the second locking portion, the two locking ends of the second locking portion latch onto the side walls of the connecting hole to lock with the driving portion.

7. A server cabinet comprising:
a first housing;
a second housing; and
a locking structure comprising:
  a main body positioned at the first housing;
  a control portion positioned inside the main body;
  a driving portion with one end rotatably mounted to the control portion; and
  a hand-held portion with one end rotatably connected to the main body and rotatably connected to the other end of the driving portion;
  wherein when the other end of the hand-held portion is operated, the hand-held portion moves towards the main body, and the driving portion moves the control portion, thereby driving the first housing to move towards the second housing;
wherein the second housing comprises an upper housing and a lower housing, the upper housing covers one end of the lower housing, the other end of the lower housing is covered by the first housing, the locking structure is positioned at the first housing and drives the first housing to move towards the upper housing.

8. The server cabinet of claim 7, further comprising a lever, wherein one end of the lever is positioned on the second housing, the other end of the lever passes through the main body to abut against the driving portion;
wherein when the hand-held portion moves towards the main body, the driving portion pushes the control portion to move, thereby the lever resisting the driving portion and driving the first housing to move towards the second housing.

9. The server cabinet of claim 7, wherein the control portion comprises two connecting portions, the two connecting portions are formed by bending both sides of the control portion along a direction away from the main body, each connecting portion defines a first rotating hole;
wherein one end of the driving portion comprises a first rotating portion, the first rotating portion axially defines a first shaft hole, the one end of the driving portion is rotatably connected to the control portion with a first rotating shaft passing through the first rotating hole and the first shaft hole.

10. The server cabinet of claim 9, wherein the other end of the driving portion opposite to the first rotating portion comprises a second rotating portion, the second rotating portion axially defines a second shaft hole;
wherein the hand-held portion comprises two second side walls and a top wall, the two second side walls are oppositely arranged and connected to the top wall, a middle portion of each of the two second side walls defines a second rotating hole, the hand-held portion is rotatably connected to the other end of the driving portion with a second rotating shaft passing through the second rotating hole and the second shaft hole.

11. The server cabinet of claim 10, wherein the locking structure further comprises a locking portion, the locking portion comprises a first locking portion and a second locking portion, each of two ends of the second locking portion extend outward to form a locking end, the hand-held portion defines a locking hole, a connecting hole is defined between the first rotating portion and the second rotating portion of the driving portion, the first locking portion is positioned in the locking hole and passes through the second locking portion, the two locking ends of the second locking portion latch onto the side walls of the connecting hole to lock with the driving portion.

12. The server cabinet of claim 7, wherein a middle portion of the main body is recessed to form a receiving slot, the receiving slot receives the control portion, the driving unit, and the hand-held unit.

13. The server cabinet of claim 12, wherein the receiving slot comprises a bottom wall, two first side walls, and two end walls, the two first side walls are positioned parallel to each other, the two end walls are also positioned parallel to each other, the two first side walls and the two end walls are all perpendicularly connected to a periphery of the bottom wall to cooperatively form the receiving slot.

14. The server cabinet of claim 13, wherein each of the two first side walls defines a first mounting hole, the hand-held portion comprises two second side walls and a top wall, the two second side walls are oppositely arranged and connected to the top wall, each of the two second side walls defines a second mounting hole, the hand-held portion is rotatably mounted to the main body by a mounting member passing through the first mounting hole and the second mounting hole.

15. The server cabinet of claim 14, wherein the locking structure further comprises a buckle portion, the buckle portion is connected to an end of the hand-held portion away from the second mounting hole, one end of the buckle portion away from the hand-held portion comprises a hook portion, the control portion defines a clamping hole, a side wall of the clamping hole is extended to form a clamping portion, the clamping portion cooperates with the hook portion to lock the buckle portion with the control portion.

* * * * *